United States Patent [19]

Blotenberg

[11] Patent Number: 4,796,213
[45] Date of Patent: Jan. 3, 1989

[54] METHOD OF FILTERING SIGNALS FOR A CONTROLLER OF A TURBO COMPRESSOR

[75] Inventor: Wilfried Blotenberg, Dinslaken, Fed. Rep. of Germany

[73] Assignee: MAN Gutehoffnungshütte GmbH, Fed. Rep. of Germany

[21] Appl. No.: 62,722

[22] Filed: Jun. 15, 1987

[30] Foreign Application Priority Data

Jun. 20, 1986 [DE] Fed. Rep. of Germany ....... 3620614

[51] Int. Cl.$^4$ .................. H03F 1/266; F04D 27/02
[52] U.S. Cl. ................................ 364/572; 415/1; 415/26
[58] Field of Search ............... 364/572, 574, 724; 333/14, 162, 165, 166; 382/22, 50, 54; 415/1, 27, 28, 72

[56] References Cited

U.S. PATENT DOCUMENTS

| 3,648,031 | 3/1972 | Neal | 364/572 |
| 4,139,328 | 2/1979 | Kuper et al. | 415/1 |
| 4,303,006 | 12/1982 | Ishigaki et al. | 364/574 X |
| 4,560,319 | 12/1985 | Blotenberg | 415/1 |
| 4,563,681 | 1/1986 | Godard | 364/572 |
| 4,691,366 | 9/1987 | Fenster et al. | 364/572 |

Primary Examiner—Vit W. Miska
Attorney, Agent, or Firm—McGlew and Tuttle

[57] ABSTRACT

Method of filtering both noisy and fluctuating input signals for a controller which is used for controlling the operation of a turbo compressor comprises obtaining an input signal from the operating device and before delivering an input signal to the controller correcting these signals through a filter whose time constant is small in one direction for example a decreasing or increasing signal amplitude directed toward the pumping limit of the operating device whose time constant is great in the other direction increasing or decreasing signal amplitude particularly away from the limit being controlled. Advantageously the filtered signal is compared with an unfiltered signal and the time constant of the filter is set as the function of the magnitude and the sign of the difference between the filtered and unfiltered signal. In addition the time constant may be reduced to a permanently pre-selected value possibly to zero when a switching threshold in a limit stages unilaterally exceeded. To be going below a switching threshold the time constant may be reset to the original time constant either immediately or after the constant is offset by hysteresis threshold.

25 Claims, 1 Drawing Sheet

METHOD OF FILTERING SIGNALS FOR A CONTROLLER OF A TURBO COMPRESSOR

FIELD AND BACKGROUND OF THE INVENTION

This invention relates in general to compressors and in particular to a new and useful method of controlling compressors in which signals for the operation of a controller for the compressor are filtered.

The invention relates particularly to a method of filtering both a noisy or fluctuating input signal for a controller, in particular a pumping limit controller, for turbo compressors. In such controllers, which are driven by measured variables to which "noise signals" are superposed, filtering the measured variables is extremely problematical because of the time delay each filter brings with it.

Generally, pumping limit controllers are so designed that the permissible minimum throughput or volumetric rate of flow is determined from the ultimate compressor pressure or from the compression ratio and then compared with the compressor throughput. At too little throughput the so-called "pumping" (surge) would occur, where the pumping medium flows back from the pressure side to the suction side in surges or periodically. In the characteristic diagram of a compressor, the pumping or surge limit line separates the stable from the instable area in which pumping could occur. The pumping limit controller sees to it that a blowoff or reorientation valve is opened at the compressor outlet when the actual working point approaches the pumping limit or a blowoff line running parallel thereto. The variable which can change the quickest is the compressor throughput. But the throughput measuring signals are always superposed by a noise signal or by fluctuations, regardless of whether the throughput or volumetric flow rate information is acquired by means of orifice, an aperture, a pressure tube, the pressure loss at the compressor inlet or in another way.

The noise signal has its origin in that eddies will always form at the flow measuring points. The consequence thereof is that the measuring signal, even at constant throughput (constant volumetric rate of flow), is subject to constant fluctuations which are disadvantageous for the succeeding processing circuits such as controls, recorders, displays, data loggers, analyzing instruments, etc.

In such processing circuits the noise is greatly disturbing because it renders the determination of the exact throughput more difficult, as these instruments always pick up a "band width". It is general practice, threfore, to filter such a noise signal out by inserting attenuators or filters so that a useful signal free of noise is generated.

However, the application of such filters in conjunction with pumping limit controllers is very disadvantageous. For, each attenuator or filter causes a delay of the measuring signal, i.e. an actual change in throughput is only transmitted with delay to the succeeding processing circuit.

But since pumping limit controllers are safety controls they must react as quickly as possible to achieve good protection of the compressor against operation in the instable area, i.e. against pumping or surge.

SUMMARY OF THE INVENTION

The invention provides a method which makes it possible to filter the noise out of the input signal to a turbocompressor controller without delaying the transmission of a measuring signal change in disadvantageous manner.

According to the invention, before the input signal for the controller is fed to the controller it is fed to a filter whose time constant is variable so it is small in one direction (decreasing or increasing) signal amplitude, in particular towards the pumping limit, while it is high in the other direction (increasing or decreasing) signal amplitude, in particular away from the pumping limit. This can be achieved, for example, in that in the stationary state, i.e. in the state where the measured variable changes only within the scope of the noise level, the filter has a very high filter time constant. This causes the noise to be filtered out of the measuring signal in the stationary state. When the system, and hence the measured variable, moves into the instationary state, i.e. beyond the normal noise level, the filter time constant of the filter is reduced to the point where the disadvantageous delaying effect of the filter is nearly precluded.

One preferred possibility of achieving this is filtering the input signal for the controller prior to feeding it to the controller; comparing the filtered signal with the unfiltered signal; and setting the filter's time constant as a function of the magnitude and sign of the difference between the filtered signal and the unfiltered signal.

If a switching threshold is unilaterally exceeded in a critical stage, the time constant may be reduced to a fixed, preselected value and be reset to the original time constant immediately after falling below this threshold again.

In an alternative embodiment of the method according to the invention the time constant is effective in one of the signal change directions only (i.e. either an increase or a decrease in signal amplitude), particularly away from the pumping onsurge limit, while no delay is effective in the other direction (no delay when control signal changing in direction toward surge limit).

The input signal for the controller may be fed to a filter whose output signal represents the minimum or maximum momentary value of the input signal, a mean noise amplitude being determined in the input signal and added to or subtracted from the filter's output signal.

The mean noise amplitude may be determined in various ways, e.g. by a computing circuit or a filter system which filters the input signal, compares the filtered signal with the unfiltered signal and determines the mean noise amplitude from the difference. The mean noise level may also be determined by two asymmetrical filters having different time constants in different directions. This is preferrably achieved in that one filter delays increasing signals and passes decreasing signals undelayed. Thus its output is always near the minimum peak value while the other filter passes increasing signals undelayed and decreasing signals with delay so that its output is always near the maximum peak value. In addition, double the mean noise amplitude is determined from the difference of these two values. The time constant of the asymmetrical filters may also be variable.

There are various possibilities as to when to determine the mean noise amplitude. For instance, it may be determined once when the controller is taken into operation and then permanently set, or it may be determined periodically repetitively. It may further be determined continuously or whenever a process parameter changes.

It is of advantage of both alternatives of the method according to the invention if the filter time constant is additionally influenced by the output signal or by the control difference of the pumping limit controller. This control difference is preferably determined in such a manner that the filter time constant is ineffective.

The filtering method according to the invention achieves good filtering of the measuring signal when the measured variable changes, i.e. when moving towards the instationary state, this time constant is made so small that the control system can readjust without time loss. In addition good filtering is provided preferably when changing into an endangered direction (toward the surge limit line) while in (from) the stationary state (steady state), and hence a measuring signal free of noise is achievable.

Accordingly it is an object of the invention to provide improved method for filtering signals for the control of the compressor.

A further object of the invention is to provide an improved method for filtering signals particularly for controlling the compressor wherein the signals which are generated by the operation of the compressor for controlling it first fit to a filter time constant is monitored.

A further object of the invention is to provide a method for controlling a compressor which control is simple to execute it inexpensive to carry out and effective for the operation of the compressor.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

GENERAL DESCRIPTION OF THE PREFERRED EMBODIMENT

Referring to drawings in particular the invention in the present case involves a method of filtering both noisy and fluctuating input signals for a controller of a compressor particularly a controller for turbo compressors having pumping or surge limits. In accordance with the method of the invention prior to feeding the input signal for the controller to the controller it is fed to a filter whose time constant is small in one direction (decreasing or increasing signal amplitude), in particular towards the pumping limit, and high in the other direction (increasing or decreasing signal amplitude), in particular away from the pumping limit.

Figure 1:
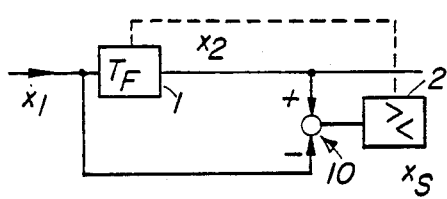
FIG. 1 is a schematized circuit for the execution of a first filtering method according to the invention.

In FIG. 1, an input signal $X_1$ representing a noisy measuring signal (i.e. an input control signal with superposed noise signal) is fed to a filter circuit 1 with the variable filter time constant $T_F$. The actual measuring signal $X_1$ is composed of the exact measured variable $X_M$ and a noise signal $X_R$ superposed to the exact measured variable.

The actual measuring signal is filtered and thereby smoothed by the filter circuit 1 with the appropriate filter time constant. This smooth signal $X_2$ is then transmitted to a controller (not shown) which utilizes the smoothed signal as a control input signal or one of it control signals.

On the other hand, before being filtered, the actual measuring signal $X_1$ is branched off the input line and fed to a comparator 10 which compares this actual measuring signal with the filtered or smoothed signal $X_2$.

As long as the system is in its stationary operating state the difference between the signals $X_1$ and $X_2$ will be at most equal to the maximum noise amplitude. Therefore, a stationary operating state can be assumed whenever the difference between the signals $X_2$ and $X_1$, i.e. the output signal of the comparator 10, is smaller than the noise amplitude $X_R$.

The output signal of the comparator 10 is fed to a limited stage 2 is connected to filter circuit 1 by line 30 and this limit stage 2 is designed so that the filter time constant $T_F$ of the filter circuit 1 is reduced to a permanently pre-selected value by signalling filter circuit 1, at least when the switching threshold $X_F$ of the limit stage 2 is unilaterally exceeded. This may possibly also be the value zero so that the filter circuit 1 can react to fluctuations in the input signal without noteworthy delay and drive the controller without time loss.

This assures that the change of the input signal in the instationary (non-steady) operating state which happens to be present in this case is transmitted without major delay.

When the system returns to the stationary state (steady state), i.e. when the switching threshold $X_S$ of the limit stage 2 is fallen below the setpoint, the time constant $T_F$ of the filter circuit 1 is immediately reset to the original value.

Figure 2:
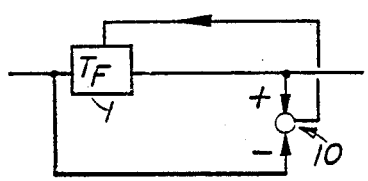
FIG. 2 is a circuit arrangement for the execution of a modified filtering method.

FIG. 2 shows an alternative circuit in which the comparator is not connected to a limit stage 2, but the comparator output is fed directly to the filter circuit 1. This causes the filter time constant $T_F$ to be controlled directly by the output of the comparator 10, i.e. by the deviation of the filtered signal from the real measuring signal. This means: The greater the deviation of the actual signal $X_1$ from the immediately preceding smoothed signal $A_2$, the more the time constant is reduced and the faster the filter circuit 1 can react.

Figure 3:
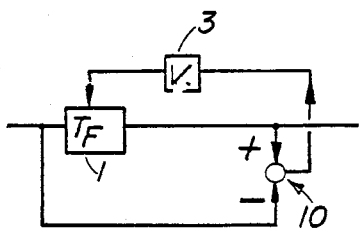
FIG. 3 is a circuit arrangement for the execution of a filtering method similar to that of FIG. 2.

Another alternative is shown in FIG. 3. There, the output signal of the comparator 10 is not fed to the filter circuit 1 directly, but via a function unit 3 whose output signal changes the time constant $T_F$ as a nonlinear function of the output signal of the comparator 10. It is possible to achieve thereby, for instance, that the filter time constant reduction becomes effective in one direction only (e.g. towards the smaller measured values $X_M$). Of course the circuits according to FIGS. 1 and 3 may also be combined so that a time constant adjustment according to FIG. 1 is made in the instationary (non-steady) state only, but according to the circuit of FIG. 3 for different signal change directions with different parameters for the dependence on the difference between the filtered and unfiltered signals from the comparator 10.

Such a circuit is not shown in the Figures, but can be imagined without difficulty by the specialist Even though the time constants and their dependence on the signal changes are freely selectable, it is still a matter of course that the filter circuit for the execution of the method according to the invention is preferably designed faster and more sensitive in the direction towards endangered signal ranges, i.e. in a surge limit controller in the direction towards the surge limit. In the direction away from endangered signal ranges the circuit for the execution of the method may be relatively sluggish or insensitive.

Figure 4:
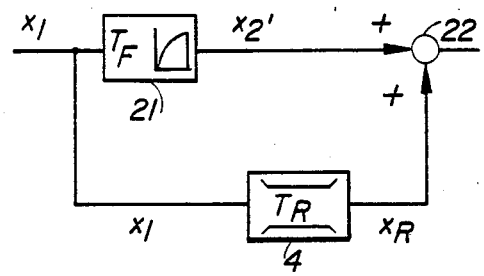
FIG. 4 is a circuit arrangment for the execution of another embodiment of filtering method.

FIG. 4 shows an alternative circuit for the execution of a filtering method.

The circuit of FIG. 4 shows a filter circuit 21 whose filter time constant $T_F$ is selected so as to be effective in one direction only, e.g. in the direction of decreasing measuring signals $X_1$ or $X_M$. This means that the output signal $X_{12}$ of the filter 21 always adjusts to, or at least follows with high speed, the proximity of the lowest momentary value of the input signal $X_1$.

In the other direction of signal changes the time constant of the filter 21 may be selected relatively high so that the output signal $X_2$ dies out relatively slowly in this direction. What this achieves is that the output signal of the filter 21 always follows without delay towards the sensitive, i.e. preferably endangered, side while following with delay or sluggishly, in the opposite, i.e. not endangered, signal change direction.

But since the output signal $X_2'$ of the filter 21 always adjusts to an extreme value of the input signal $X_1$, this actual value is shifted by the mean noise amplitude of the input signal $X_1$. To obtain a correct, filtered measuring signal it is necessary, therefore, to add to or subtract from the output signal $X_2'$ the mean noise signal $X_R$. This purpose is served by another measuring circuit 4 which determines the mean noise amplitude from the input signal $X_1$. This circuit 4 may be a filter circuit according to FIGS. 1 to 3 in which the comparator 10 determines the quantity $X_2-X_1$ and furnishes it to the adder 22 as noise amplitude. The output signal of the adder 22 then serves as control signal for the controller (not shown).

Figure 5:
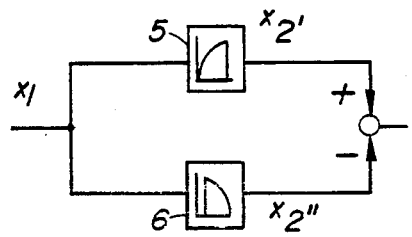
FIG. 5 is a circuit for the determination of the mean noise amplitude of an input signal.

Another alternative for the measuring circuit 4 is shown in FIG. 5.

The circuit for the determination of the mean noise amplitude of FIG. 5 shows two asymmetrical filters 5, 6. The filters 5 and 6, respectively, are filters which have a high time constant in one direction, but a small time constant in the other. For instance, filter 5 passes increasing signals with delay, but decreasing signals without delay. This means that the output signal of filter 5, similar to the output of the filter 21 of FIG. 4, is always at the minimum peak $X_2'$ of the input signal $X_1$.

On the other hand, the filter 6 is oppositely asymmetric, i.e. it passes increasing signals without delay and decreasing signal with delay. This means that the output of filter 6 is always near the maximum peak $X_2''$ of the input signal $X_1$.

By forming the difference between the extremes $X_2'$ and $X_2''$ double the mean noise amplitude can be determined. After halving the latter in the adder 22 per FIG. 4, it can be added to the minimum peak value to form the actual, filtered signal.

Another possibility, not shown in the Figures, of determining the mean noise amplitude would be the use of a computing circuit which measures and stores the maximum or minimum peaks of the unfiltered input signal within a specified time span. Out of the highest maximum and the lowest minimum within this time span the difference is formed and halved. This results in the mean noise amplitude which is then fed to the adder 22.

Of course, the maxima or minima acquired in the measuring time span may each also be averaged in the same manner and the difference formed from this mean to obtain double the noise amplitude.

Basically, there are various possibilities as to how to determine the mean noise amplitude.

One of these possibilities would be to determine this quantity once when the control system is taken into operation and then set it permanently to the value determined.

Another possibility, especially for the circuit per FIG. 5, for instance, would be a continuous determination of the mean noise amplitude.

In addition, this correction quantity may be determined in periodic repetition by any one of the above mentioned methods.

Another possibility consists in that a new determination of the mean noise amplitude is made whenever one of the process parameters changes, e.g. in case of a change in throughput (volumetric flow control), pressure, control difference of the pumping controller, speed, guidevane position, capacity, output of any controller involved, and so forth.

If one of the process parameters changes during the determination of the mean noise amplitude, the determination of the noise amplitude may be stopped and restarted immediately thereafter.

Figure 6:
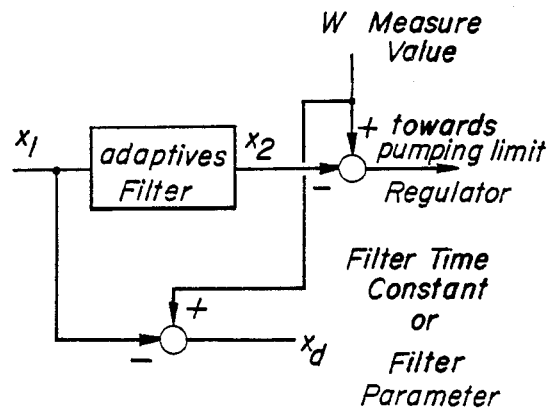
FIG. 6 is another circuit for the execution of the method according to the invention.

FIG. 6 represents another embodiment of the above described arrangements. It is repeatedly mentioned in the technical description that the filter time constant is varied as a function of the control difference. However, the control difference is normally formed as difference between set-point value and actual value. But since the filter is inserted in the actual value branch, the control difference is also influenced by the filter.

FIG. 6 shows another variant. There, two control differences are formed. For the control difference fed to the controller, the difference between set-point value and filtered, actual value is formed. But the control difference to influence the filter parameters is formed as the difference between set-point value and unfiltered, actual value.

The adaptive filter shown in FIG. 6 may be anyone of the others shown.

While specific embodiments of the invention have been shown and described in detail to illustrate the application of the principles of the invention, it will be understood that the invention may be embodied otherwise without departing from such principles.

What is claimed is:

1. A method of filtering out undesired signals associated with a control input signal prior to input of the control input signal to a controller, the control input signal having an input signal amplitude, the control input signal representing the relationship between a sensed turbocompressor parameter of operation and a surge limit line representing a limit, beyond which the turbocompressor experiences surge, the amplitude of the control input signal increasing or decreasing with respect to the surge limit line indicating the operation of the turbocompressor going closer to or away from surge, respectively, comprising the steps of: feeding the input signal to a filter having a time constant; determining whether the control input signal is increasing or decreasing in amplitude with respect to the surge limit line; and, lowering the time constant when an increase in the control input signal is detected with respect to the surge limit line.

2. A method according to claim 1, wherein: said input control signal prior to being fed to said filter is an unfiltered signal and a signal output from said filter is a filtered signal, further comprising the steps of: comparing said filtered signal output from said filter with the unfiltered signal, selecting the time constant of the filter as a function of the magnitude and as a function of the sign of the difference between the filtered signal and the unfiltered signal.

3. A method according to claim 2, wherein: the time constant has a first time constant value and a second time constant value, said time constant being switched to said second time constant value when the difference between the filtered signal and the unfiltered signal exceeds a switching threshold.

4. A method according to claim 3, wherein: said time constant is switched from said second time constant value back to said first time constant value after one of the difference between the filtered signal and unfiltered signal returning to a value within the switching threshold and after a lag time after the difference between the filtered signal and the unfiltered signal returns to a value within the switching threshold.

5. A method according to claim 2, wherein: the time constant is adjusted as a function of the magnitude of the difference between the filtered signal and the unfiltered signal, said time constant being adjusted so the time constant is smaller when the difference is greater.

6. A method according to claim 5, wherein: the time constant is adjusted so as to be a non-linear function of the difference between the filtered signal and unfiltered signal.

7. A method according to claim 2, wherein: said time constant is invariable when the input control signal is in a steady state.

8. A method according to claim 7, wherein: said time constant is selected in dependence upon the amplitude of the control input signal.

9. A method according to claim 7, wherein: the time constant is adjusted as a function of the difference between the filtered and unfiltered signals, an increase of the difference between filtered and unfiltered signals being adjusted based on a first set of parameters and a decrease in the difference between filtered and unfiltered signals being adjusted based on a set of parameters different from said first set of parameters.

10. A method according to one of claims 7, 8, or 9, wherein: the variable time constant is effective in one signal change direction only, in particular in said increasing direction, said time constant having an invariable value in a decreasing direction.

11. A method according to claim 1, wherein: the time constant is effective for one of the increasing and decreasing control input signals and is ineffective in the other of one of the increasing and decreasing control input signals.

12. A method according to claim 1, further comprising: feeding said input control signal to a further filter which outputs a signal representing the peak value (highest or lowest) of the input control signal, and determining the mean amplitude of a superposed noise signal in the control input signal; and, adding the amplitude of the noise signal to the output of the further filter.

13. A method according to claim 12, wherein: the mean noise amplitude is determined by said further filter which filters the control input signal, the filtered signal being compared with the unfiltered signal to determine the mean noise amplitude from the difference of the filtered signal and unfiltered signal.

14. A method according to claim 12, wherein: the mean noise amplitude is determined by a computing circuit which stores the maximum and minimum peaks of the control input signal within a specified period of time and forms the difference from the highest maximum and the lowest minimum within the specified period of time, and divides the difference by 2.

15. A method according to claim 12, wherein: the mean noise amplitude of the control input signal is determined by two asymmetrical filters which have an effective time constant for a decreasing control input signal and have no time constant for an increasing control input signal.

16. A method according to claim 12, wherein: the mean noise amplitude of the input control signal is determined in a circuit wherein said filter includes a first filter part which passes increasing control input signals with delay and decreasing control input signals without delay and a second filter part which passes increasing control input signals without delay and decreasing control input signals with delay.

17. A method according to claim 12, wherein: the mean noise amplitude of the control input signal is determined once when the turbocompressor controller is taken into operation.

18. A method according to claim 12, wherein: the mean noise amplitude determination is repeated periodically.

19. A method according to claim 13, wherein the mean noise amplitude is determined continuously.

20. A method according to claim 13, wherein: the mean noise amplitude of the control input signal is determined whenever there is a change in a processed parameter detected in formulation said control input signal, such as volumetric flow rate, intake pressure, discharge pressure, turbocompressor speed, guide vane position.

21. A method according to claim 12, wherein: any change in a process parameter occurs during the determination of the mean noise amplitude, determination of mean noise amplitude is stopped immediately and restarted.

22. A method according to claim 1, wherein: the filtered time constant is additionally varied by the output signal of the controller.

23. A method according to claim 1, wherein: the filtered time constant is additionally influenced by the control difference of the pumping limit controller.

24. A method according to one of claims 1, 2, and 7 or 12, wherein changing the time constant is delayed timewise.

25. A method according to claim 23, wherein: the control difference is formed in such a manner that the filtered time constant is ineffective.

* * * * *